310-334

7/15/80 XR 4,213,071

United States Patent [19]

Podgorski

[11] 4,213,071

[45] Jul. 15, 1980

[54] OXYGEN FILLED, SEALED HOUSING FOR PIEZOCERAMIC ELECTROACOUSTIC TRANSDUCER

[75] Inventor: Jan Podgorski, Bergisch Gladbach, Fed. Rep. of Germany

[73] Assignee: INTERATOM Internationale Atomreaktorbau GmbH, Bergisch Gladbach, Fed. Rep. of Germany

[21] Appl. No.: 841,756

[22] Filed: Oct. 13, 1977

[30] Foreign Application Priority Data

Oct. 14, 1976 [DE] Fed. Rep. of Germany ....... 2646389

[51] Int. Cl.$^2$ .............................................. H01L 41/10

[52] U.S. Cl. ..................................... 310/344; 310/334

[58] Field of Search ................................ 310/322-324, 310/312, 331, 332, 334, 336-338, 340, 341, 342-344, 363, 364

[56] References Cited

U.S. PATENT DOCUMENTS

| | | | |
|---|---|---|---|
| 2,095,376 | 10/1937 | Bechmann | 310/364 |
| 2,266,333 | 12/1941 | Ream | 310/340 |
| 2,636,134 | 4/1953 | Arons et al. | 310/363 X |
| 2,794,132 | 5/1957 | Zapponi | 310/340 |
| 2,833,942 | 5/1958 | Ravich | 310/344 |
| 3,054,982 | 9/1962 | Kieser | 310/342 X |
| 3,931,388 | 1/1976 | Hafner et al. | 310/344 |
| 3,970,878 | 7/1976 | Berglund | 310/344 X |

FOREIGN PATENT DOCUMENTS

| | | | |
|---|---|---|---|
| 1027735 | 4/1958 | Fed. Rep. of Germany | 310/340 |

*Primary Examiner*—Mark O. Budd

*Attorney, Agent, or Firm*—Herbert L. Lerner

[57] ABSTRACT

Electroacoustic transducer having a piezoceramic transducer element includes an oxygen-impermeable and oxygen-nonabsorbing enclosure wherein the transducer element is received.

6 Claims, 3 Drawing Figures

OXYGEN FILLED, SEALED HOUSING FOR PIEZOCERAMIC ELECTROACOUSTIC TRANSDUCER

The invention relates to an electroacoustic transducer having a piezoceramic transducer element. Like quartz crystals, certain ceramic substances such as lithium niobate exhibit piezoelectric properties i.e. changes in the charge occur along the electrical axis thereof the instant they are stressed in compression in direction of the mechanical axis, or such substances react, in reverse, mechanically by elongation or contraction to variations in electrical charges. The advantage thereof over other heretofore known piezoelectric substances is the stability thereof at high temperatures if certain conditions are maintained, as will be explained hereinafter. Lithium niobate especially permits the construction of devices which have high sensitivity although they are of relatively small dimensions. Also, the transfer characteristic thereof extends to higher frequencies, which makes it particularly suitable for use in electroacoustic transducers, by means of which interference noise of all types, for example, boiling noises in nuclear plant cooled with liquid metal are to be detected. These boiling noises are primarily expected in incipient operating trouble and stand out better in the higher frequency range over the background noise stemming from pumps and the like. Nuclear reactors of the hereinaforementioned type are operated at temperatures around 900 K.; it has been found that the lithium niobate is decomposed at such temperatures by reduction if the partial oxygen pressure in the environment is lower than that in the ceramic itself. To meet this problem, the lithium niobate has previously been housed in closed steel capsules (cf., J. Bishop/G. H. Broomfield/J. Foley, "High-temperature Acoustic Transducers for Use in LMFBR", IAEA Specialist Meeting on In-Core and Primary Circuit Instrumentation of LMFBR's, December 1975), and additional oxygen-emitting materials, such as nickel oxide, for example, were included in the steel capsule to compensate for the oxygen absorption by the steel; however, this measure did not meet the expectations. An alternative possibility of maintaining the necessary partial oxygen pressure is to feed air or pure oxygen to the capsule from the outside. However, if used in liquid metal-cooled nuclear reactors, this method encounters objections because of the chemical incompatibility of the oxygen with the liquid metal, in view of possible accidents which could affect the oxygen lines.

It is accordingly an object of the invention to provide an electroacoustic transducer having a piezoceramic transducer element, especially a transducer element formed of lithium niobate, which is operatable at high operating temperatures and without an external oxygen supply.

With the foregoing and other objects in view, there is provided, in accordance with the invention, an electroacoustic transducer having a piezoceramic transducer element comprising an oxygen-impermeable and oxygen-nonabsorbing enclosure wherein the transducer element is received. Due to the close contact of the enclosure, proper and trouble-free mechanical coupling between the piezoceramic material and the surrounding medium is ensured.

In accordance with another feature of the invention, the enclosure is electrically conductive, so that it can serve simultaneously as one of the two electrodes applied to the piezoceramic.

These requirements are met especially well, in accordance with a further feature of the invention, by forming the enclosure of a thin sheet of noble metal. In addition to high electric conductivity, these noble metals have radiation resistance which is adequate for use in nuclear reactors and good corrosion resistance.

At the planned operating temperatures of up to 950 K., the enclosure is formed advantageously of platinum sheet. Gold, with the relatively low melting point thereof, appears less suitable for this purpose, and thodium raises certain problems with respect to the machining thereof.

It will not be possible for the enclosure to make tight contact with the piezoceramic material on all sides, since leadthroughs or passageways for electrical lines etc. must be provided at the enclosure. The spaces or voids, which are thereby unavoidably created in the enclosure, are filled with oxygen, in accordance with yet another feature of the invention, so that also from this standpoint, the lithium niobate remains protected against decomposition.

In accordance with yet a further feature of the invention, the transducer element is formed of two oppositely polarized disks of piezoceramic material, which are separated from each other by a metal foil which forms an electrode (and which is advantageously formed of the same metal as that of the enclosure). The electric potential difference generated therein when mechanical vibrations act thereon can thus be taken off at one pole, the enclosure serving as an electrode (the latter being formed of two halves joined electrically conductively together, for example, by brazing), and at the other pole between both disks, from where a lead can be drawn outwardly while being insulated with respect to the enclosure.

In accordance with a concomitant feature of the invention, the electroacoustic transducer is provided with a sound-receiving and/or transmitting diaphragm, the piezoceramic transducer element received in the enclosure being pressed against the diaphragm under spring pressure, thereby providing for a proper transfer of the sound vibrations from the diaphragm to the transducer element.

Although the invention is illustrated and described herein as embodied in piezoceramic electroacoustic transducer, it is nevertheless not intended to be limited to the details shown, since various modifications and structural changes may be made therein without departing from the spirit of the invention and within the scope and range of equivalents of the claims.

The construction and method of the invention, however, together with additional objects and advantages thereof will be best understood from the following description of specific embodiments when read in connection with the accompanying drawings, in which.

Figure 1:
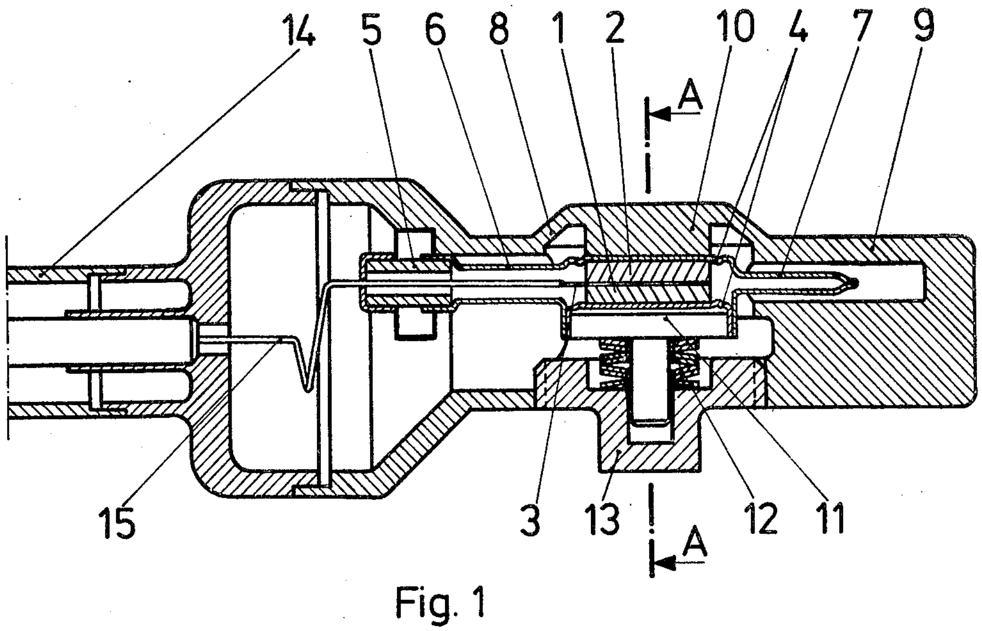
FIG. 1 is a longitudinal sectional view of an electroacoustic transducer constructed in accordance with the invention and taken along the line B—B of FIG. 2.
Figure 2:
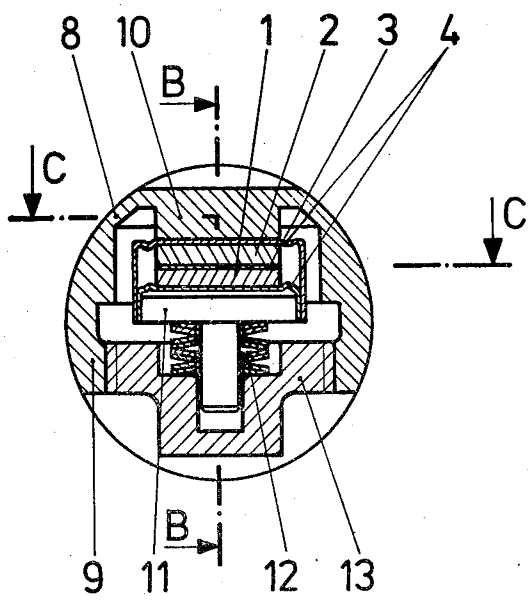
FIG. 2 is a cross-sectional view of FIG. 1 taken along the line A—A.
Figure 3:
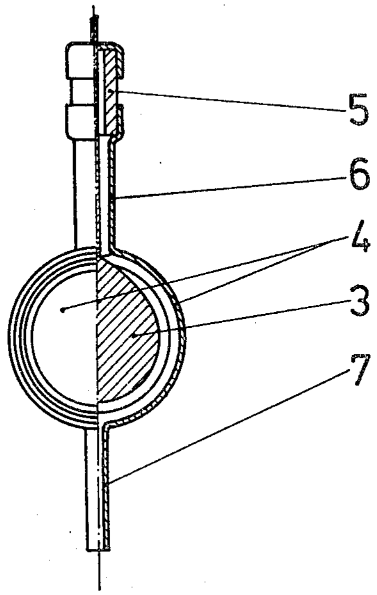
FIG. 3 is a fragmentary view of FIG. 2, showing, partly in section, a transducer element per se taken along the line C—C of FIG. 2.

Referring now to the figures of the drawing, the transducer element per se is formed of two disks 1 and 2 of lithium niobate $LiNbO_3$, between which a foil 3 of a noble metal, as one electrode 3 of the two electrodes of the device, is disposed. An enclosure 4, also formed of noble metal and consisting of two shells brazed together, makes close contact with the major part of the surface of the disks 1 and 2 and further serves as the second electrode. Access to this second electrode 4 is provided also by a metallic housing 9, the material of which is selected in accordance with the requirements with respect to corrosion resistance against the medium in which it is used. The enclosure 4 has a connecting pipe or stub 6 with a plug 5, for example, of a metal ceramic, by means of which a lead 15, electrically insulated from the enclosure 4, is brought to the fist electrode 3. The enclosure 4 has a further connecting pipe or stub 7, by means of which (not shown here) the interior of enclosure 4 can be evacuated and subsequently filled with oxygen. Then the stub 7 is sealed off by being fused. Separated by thin-walled parts 8 from the main part of the housing 9, there is provided a thicker part 10 thereof which is constructed as a diaphragm that, upon receiving sonic or ultrasonic vibrations, places a mechanical load on the lithium niobate disks 1 and 2 through the interposed enclosure 4, and thus produces piezoelectric effects therein. The mechanical coupling between these parts is improved in that the disks 1 and 2 and the enclosure 4 are mutually pressed together and are, in turn, pressed against the diaphragm 10 by means of a plunger 11. The plunger 11 is loaded by a spring 12 of a high-temperature-resistant material such as a nickel-chromium-cobalt alloy. The magnitude of the contact pressure can be adapted to the requirements by turning a threaded plug 13, which serves as an abutment or counterbearing for the spring 12, to different depths into the housing 9. The housing 9 is fastened at one end thereof to a tubular handle 14, not described in any further detail as the specific construction thereof is unnecessary for the invention. An electric line 15 is led through the tubular handle 14 which thereby permits the transducer to be brought to the point of use, for example, for monitoring the coolant flow in the fuel assembly of a sodium-cooled nuclear reactor.

There are claimed:

1. Electroacoustic transducer having a piezoceramic transducer element comprising an enclosure wherein the tranducer element is received, said enclosure defining spaces therein filled with oxygen and being oxygen-impermeable and oxygen-nonabsorbing at temperatures exceeding the temperature at which the transducer element decomposes when the ambient partial pressure of oxygen is lower than the partial pressure of oxygen in the transducer element itself.

2. Electroacoustic transducer according to claim 1 wherein said enclosure is electrically conductive.

3. Electroacoustic transducer according to claim 2 wherein said enclosure is formed of a thin sheet of noble metal.

4. Electroacoustic transducer according to claim 1 wherein the transducer element is formed of two oppositely polarized disks of piezoceramic, and an electrode-forming metal for separating said two disks from one another.

5. Electroacoustic transducer according to claim 1 including a diaphragm having at least one of the capabilities of receiving and transmitting sound, and spring means for pressing the enclosed transducer element against said diaphragm.

6. Electroacoustic transducer according to claim 1, wherein the partial pressure of the oxygen in the enclosure is higher than the partial pressure of the oxygen in the transducer element at operating temperature.

* * * * *